(12) United States Patent
Jochym et al.

(10) Patent No.: US 6,747,217 B1
(45) Date of Patent: Jun. 8, 2004

(54) ALTERNATIVE TO THROUGH-HOLE-PLATING IN A PRINTED CIRCUIT BOARD

(75) Inventors: Daniel A. Jochym, Downingtown, PA (US); Robert H. Fix, Schwenksville, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/989,820

(22) Filed: Nov. 20, 2001

(51) Int. Cl.[7] .......................... H01R 12/04; H05K 1/11
(52) U.S. Cl. ........................ 174/265; 174/266
(58) Field of Search ................... 174/265, 267, 174/262–264, 266; 29/842, 843, 844, 845; 361/792, 793, 794, 803

(56) References Cited

U.S. PATENT DOCUMENTS

| | | | | |
|---|---|---|---|---|
| 2,752,580 A | * | 8/1956 | Shewmaker | 174/262 |
| 3,524,960 A | * | 8/1970 | Lohff | 174/262 |
| 3,660,726 A | * | 5/1972 | Ammon et al. | 174/262 |
| 5,290,970 A | * | 3/1994 | Currie | 174/250 |
| 5,619,018 A | * | 4/1997 | Rossi | 174/261 |
| 5,656,798 A | * | 8/1997 | Kubo et al. | 174/263 |
| 5,761,050 A | * | 6/1998 | Archer | 361/791 |
| 6,011,222 A | * | 1/2000 | Sekiya et al. | 174/266 |
| 6,255,601 B1 | * | 7/2001 | Burkhart | 174/255 |
| 6,333,471 B1 | * | 12/2001 | Nojioka | 174/261 |

* cited by examiner

Primary Examiner—David A. Zarneke
Assistant Examiner—Jeremy Norris
(74) Attorney, Agent, or Firm—Michael B. Atlass; Mark T. Starr

(57) ABSTRACT

A printed circuit board (PCB) comprises a number of electrically conductive layers. Instead of coating, or plating, a PCB through-hole with an electrically conductive material to form a via (for the purpose of connecting together signal paths across the electrically conductive layers)—the via is formed by placing a conductive stake, or conductive pin, in the through-hole.

6 Claims, 10 Drawing Sheets

US 6,747,217 B1

ALTERNATIVE TO THROUGH-HOLE-PLATING IN A PRINTED CIRCUIT BOARD

FIELD OF THE INVENTION

This invention relates generally to manufacturing and, more particularly, to printed circuit boards (PCBs).

BACKGROUND OF THE INVENTION

A printed circuit board (PCB) (also referred to as a printed wiring board (PWB), or a PC Larninate (PC Lam)) provides a mechanism for implementing a circuit design (i.e., the interconnection of electrical devices and components). A PCB may be "single layer," "double layer," or "multi-layer"—each of which refers to the number of electrically conductive layers. A multi-layer board comprises alternating layers of conductive material and electrically insulating material bonded together. (As used herein, terms of the form "conductive" and "insulating" refer to the properties of electrical conduction and electrical insulation, respectively.)

In order to connect signal paths from one conductive layer to another conductive layer, holes (or through-holes) are drilled through a PCB and are subsequently coated, or plated, with a conductive substance (there are a variety of known techniques for through-hole-plating). These plated-through-holes are also referred to as "vias." In high-density circuit designs, the number of components—and the resulting signal paths interconnecting the components—typically require use of multi-layer boards with thousands of vias. (It should be noted that there are also other types of holes drilled into a PCB, e.g., "component holes" for receiving the pins of a surface mount component.)

Each through-hole comprises a length (which corresponds to the thickness of the PCB across all of the layers) and a diameter. In general, in order to plate the through-hole, the through-hole must have a minimum diameter that is a direct function of the thickness of the PCB, which itself is determined as a function of the design of each layer. (Layers do not have to be the same thickness, and can vary in thickness as a function of the electrical characteristics desired. In addition, this minimum through-hole diameter may also be a function of the particular plating technique, which is not described herein.)

SUMMARY OF THE INVENTION

Obviously, the design of a PCB—and the number of conductive layers to use—is directly influenced by the particular circuit design. However, we have also observed that as the decision is made to increase the thickness of the PCB—there may be a concomitant increase in the amount of space, i.e., the minimum diameter, required by through-holes—space that cannot be used to route signals.

Therefore, and in accordance with the invention, instead of coating, or plating a through-hole with a conductive material to form a via—the via is formed by placing a conductive stake in the through-hole for electrically coupling foils disposed on at least two electrically conductive layers together. Thus, as the thickness of a PCB increases, the diameter of the individual through-holes stay the same and the amount of space taken up by through-holes does not change.

In an embodiment of the invention, a conductive stake is inserted into a through-hole of a PCB for the purpose of forming a via. The conductive stake comprises, e.g., a phosphor bronze material, and is gold-over-nickel plated. The length of the conductive stake is at least as long as the distance between two conductive layers of the PCB. A diameter of the conductive stake is approximately greater than, or equal to, the diameter of the through-hole.

DETAILED DESCRIPTION

Figure 1:
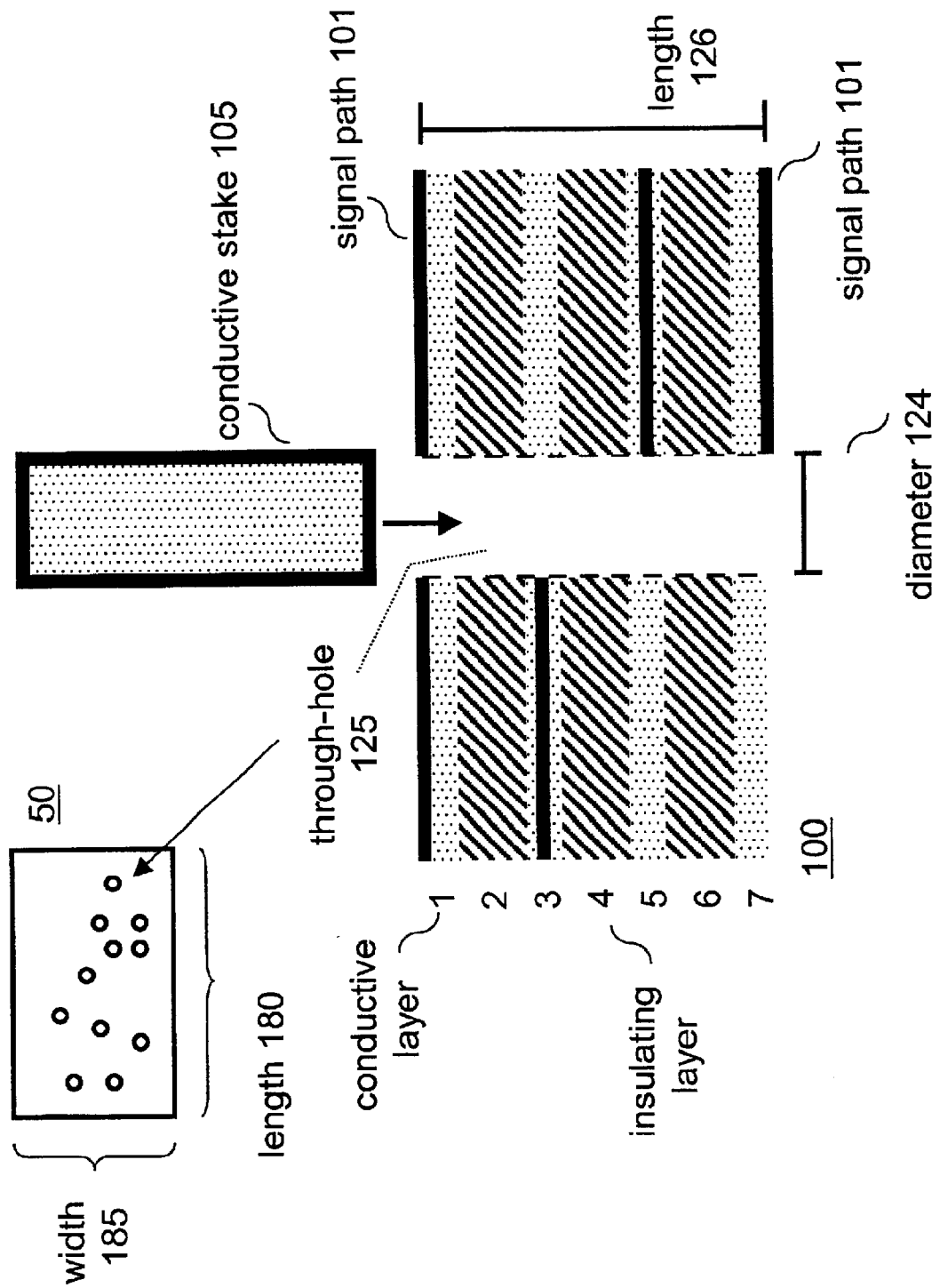
FIGS. 1 and 2 show a portion of a cross-section of a printed circuit board such that the conductive layers are coupled together in accordance with the principles of the invention.
Figure 2:
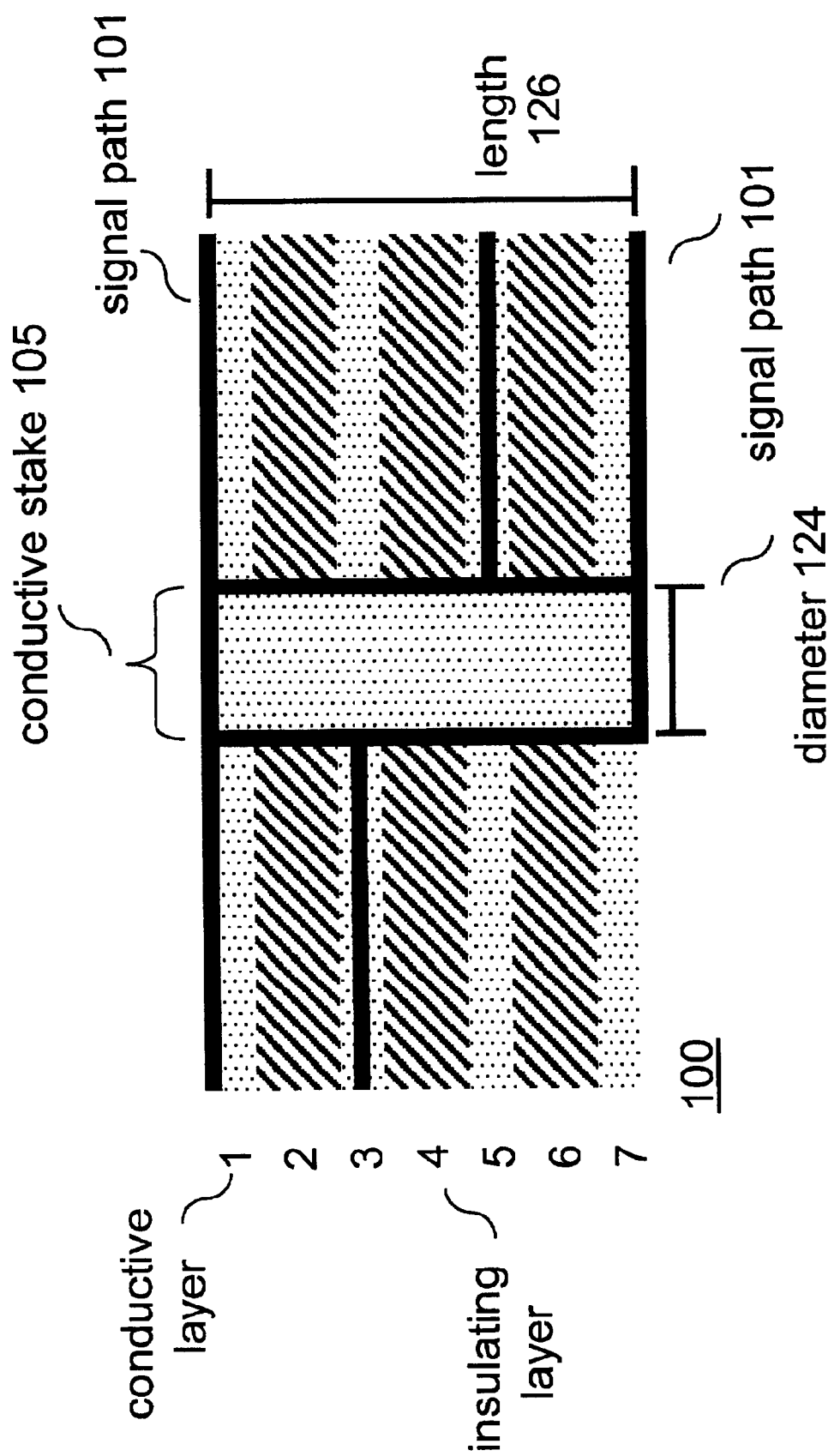

FIGS. 1 and 2 show a portion of a cross-section of a printed circuit board (PCB) such that signal paths on different conductive layers are electrically coupled together in accordance with the principles of the invention. Other than the inventive concept, the elements shown in FIGS. 1 and 2 are well known and will not be described in detail. For example, techniques for forming a through-hole are well known and not described herein (e.g., drilling of a through-hole is performed by computer numerical control (CNC) drilling equipment and tungsten-carbide drills; laser ablation; etc., as known in the art). As such, familiarity with PCB construction techniques is assumed. For the purposes of this description, the term multi-layer also refers to double layer boards. As used herein, the term "conductive layer" refers to any trace (or foil) of conductive material placed upon an insulating layer for providing a pathway for an electrical signal.

Turning to FIG. 1, a top view of a PCB 50 is shown. PCB 50 comprises a length 180 and a width 185 and also comprises a number of through-holes as represented by circles. (It should be noted that a PCB can comprise thousands of through-holes.) One of these through-holes, 125, is illustratively shown in a cross-section view of portion 100 of PCB 50. Also shown is an illustrative signal path 101 (as represented by the thicker black line). PCB portion 100 comprises four conductive layers (1, 3, 5 and 7) as represented by the stippling; and three insulating layers (2, 4 and 6) as represented by the diagonal cross-hatching. FIG. 1 is not to scale. In this example, it is assumed that illustrative signal path 101 should appear on conductive layers 1, 3, 5, and 7 as represented by the thicker black line (which could be viewed as the foil placed on each conductive layer for signal path 101). An illustrative through-hole 125 has been formed in PCB portion 100 for the purpose of coupling the foil on each of the conductive layers together. Through-hole 125 has a length 126 (which also corresponds to the thickness of PCB portion 100) and a diameter 124. (A common size for a diameter of a through-hole is in the range of 10 to 25 mils (thousandths of an inch).) As can be observed from FIG. 1, a conductive stake (other equivalent terms are, e.g., conductive insert, conductive pin, conductive sleeve, etc.)

105 is arranged for insertion into through-hole 125. Conductive stake 105 has a conductive plating (e.g., gold-over-nickel plating) as represented by the thicker black lines, a length approximating length 126, and a diameter greater than or equal to diameter 124 (described further below).

Turning now to FIG. 2, this figure shows the arrangement of conductive stake 105 in PCB portion 100 after insertion in through-hole 125. As can be observed from FIG. 2, and in accordance with the inventive concept, a via has been formed for electrically connecting conductive layers 1, 3, 5 and 7 together so that electrical signals transmitted on signal path 101 appears on all 4 conductive layers.

Figure 3:
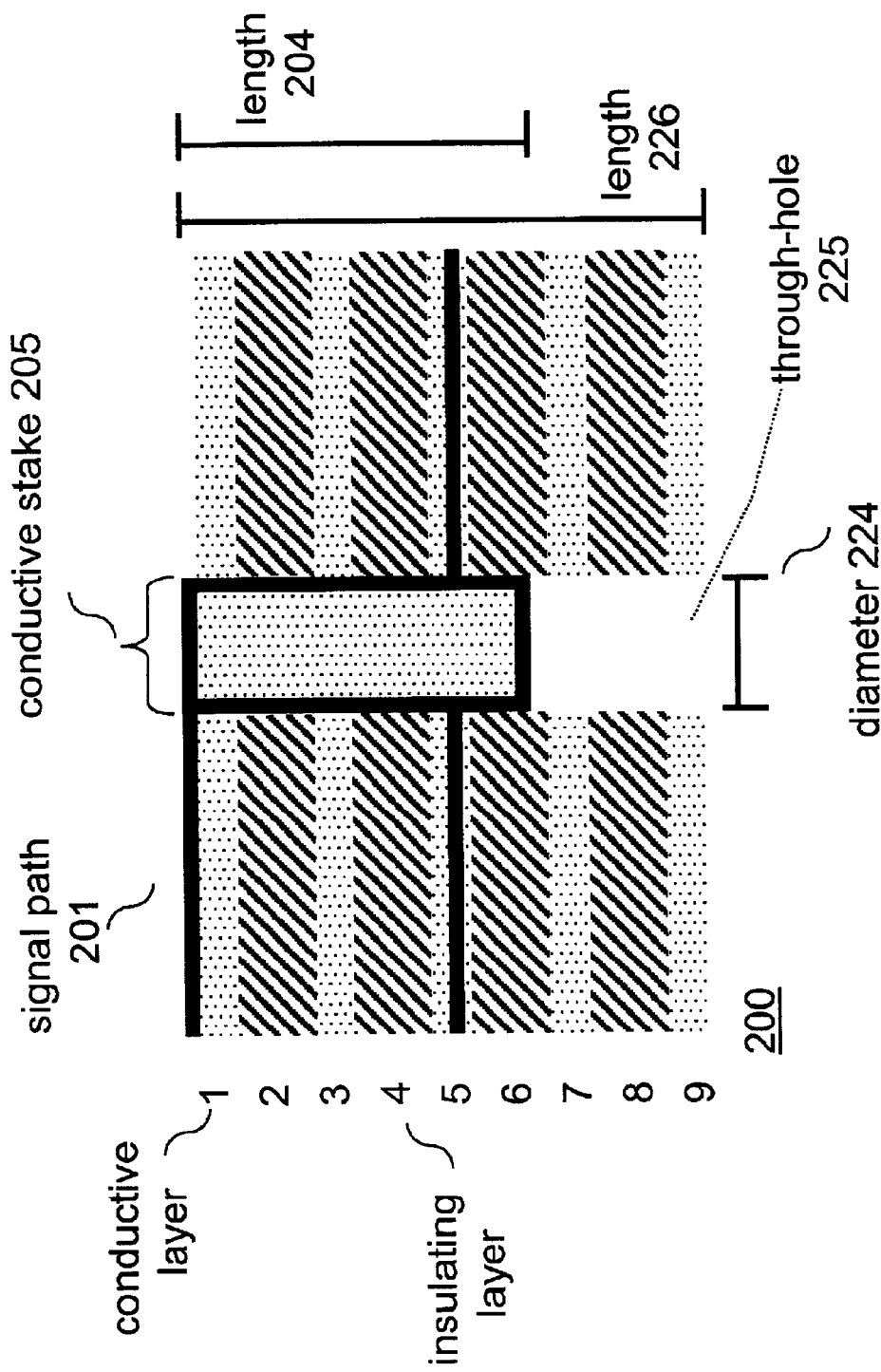
FIGS. 3, 4, 5 and 6 show other illustrative embodiments of the invention.
Figure 4:
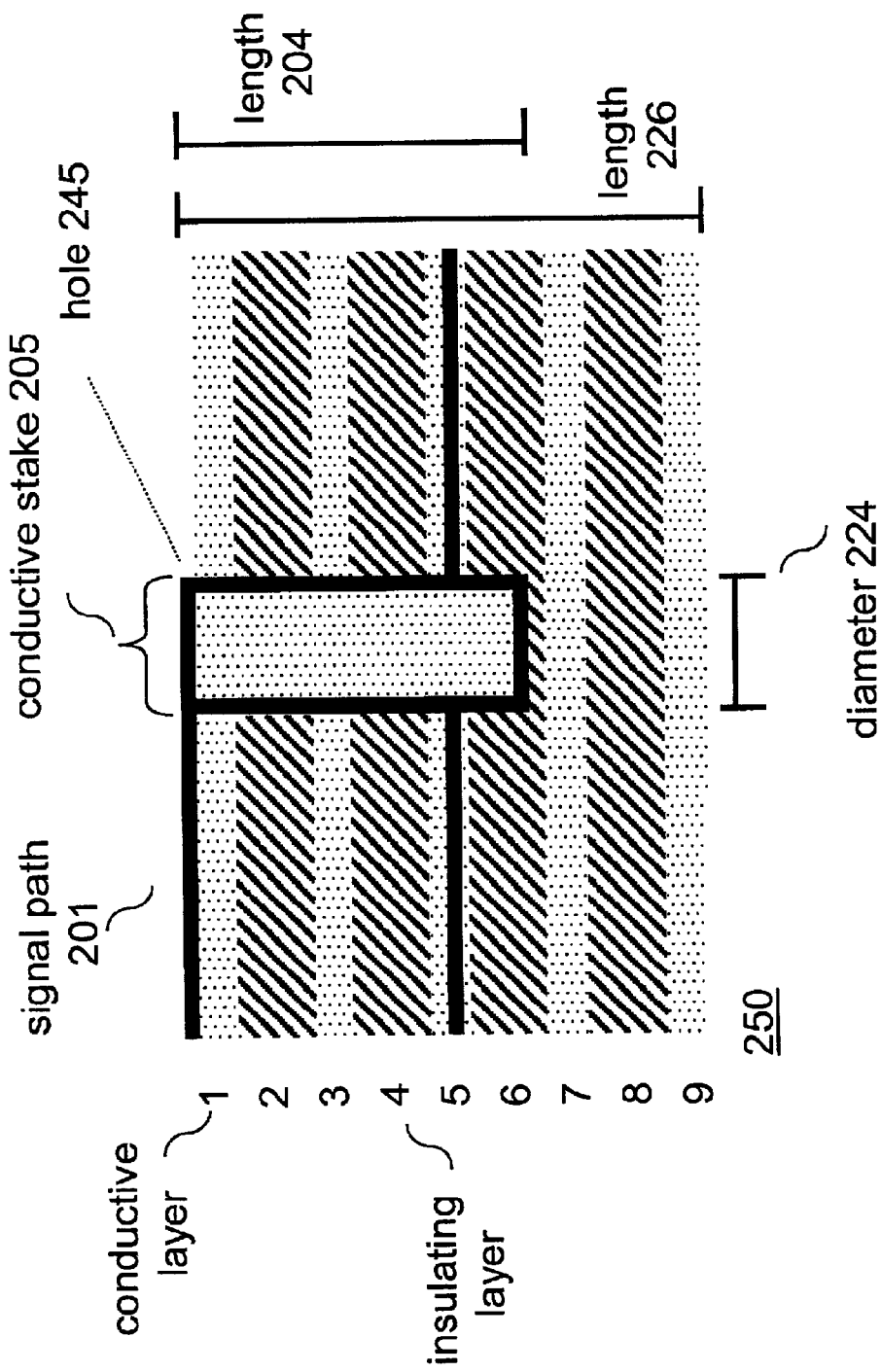

FIG. 3 illustrates another embodiment of the inventive concept. A cross-section view of a portion 200 of a PCB is shown for an illustrative through-hole 225. PCB portion 200 comprises five conductive layers (1, 3, 5, 7 and 9) as represented by the stippling; and four insulating layers (2, 4, 6 and 8) as represented by the diagonal cross-hatching. FIG. 3 is not to scale. An illustrative through-hole 225 has been formed in PCB portion 200 for the purpose of coupling at least some of the conductive layers together. Through-hole 225 has a length 226 (which also corresponds to the thickness of PCB portion 200) and a diameter 224. In this example, it is assumed that traces for a signal path 201 (as represented by the thicker black line) on conductive layers 1 and 5 must be coupled together. As can be observed from FIG. 3, a conductive stake 205 is inserted into through-hole 225 for forming a via for electrically connecting the foils on conductive layers 1 and 5 together. In this example, the length 204 of conductive stake 205 is less than length 226 and the diameter is greater than or equal to diameter 224 (described further below). It should also be noted that the inventive concept is applicable to a "blind-via" This is shown in FIG. 4. Like numbers indicate similar elements and are not described further. In FIG. 4, conductive stake 205 is inserted into hole 245 of PCB portion 250. As can be observed from FIG. 4, hole 245 does not completely go through PCB portion 250. Upon the insertion of conductive stake 205 a "blind via" is formed.

Figure 5:
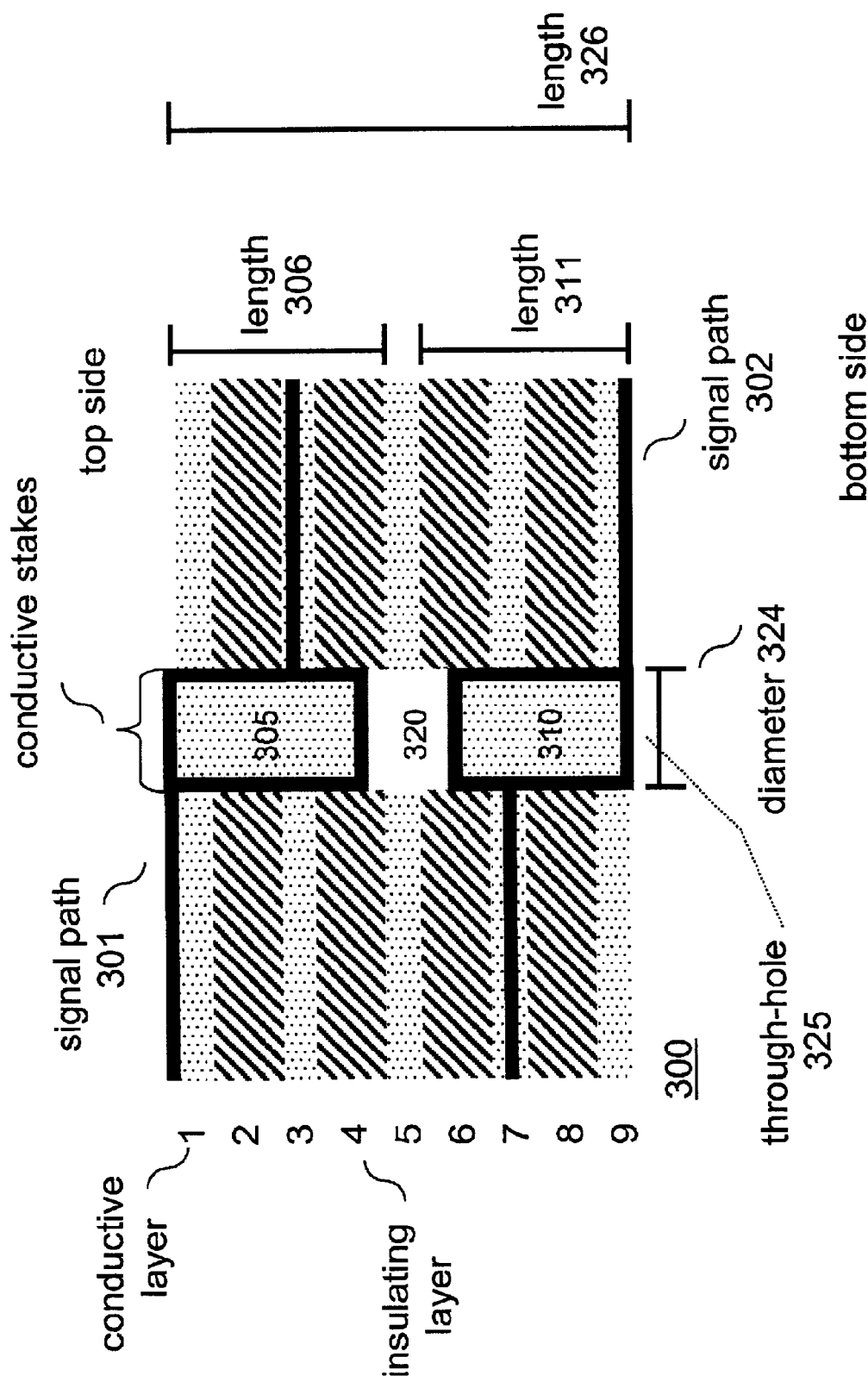
Figure 6:
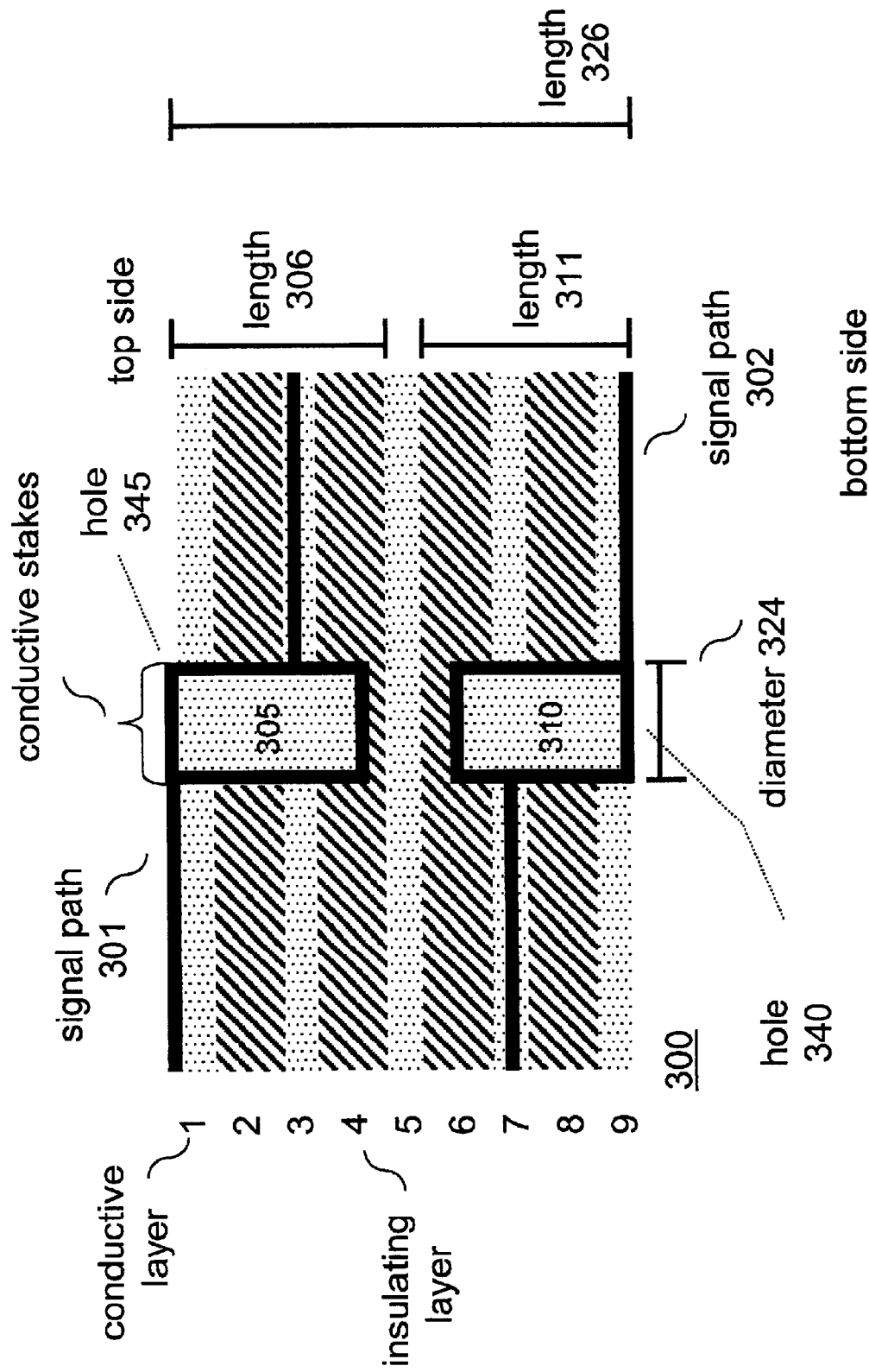

FIG. 5 illustrates another embodiment of the inventive concept. A cross-section view of a portion 300 of a PCB is shown for an illustrative through-hole 325. PCB portion 300 comprises five conductive layers (1, 3, 5, 7 and 9) as represented by the stippling; and four insulating layers (2, 4, 6 and 8) as represented by the diagonal crosshatching. FIG. 5 is not to scale. An illustrative through-hole 325 has been formed in PCB portion 300 for the purpose of coupling at least some of the conductive layers together. Through-hole 325 has a length 326 (which also corresponds to the thickness of PCB portion 300) and a diameter 324. In this example, it is assumed that traces for a signal path 301 (as represented by the thicker black line) on conductive layers 1 and 3 must be coupled together. In addition, it is assumed that traces for a signal path 302 (as represented by the thicker black line) on conductive layers 7 and 9 must be coupled together. As can be observed from FIG. 5, a conductive stake 305 is inserted into through-hole 325 from the topside of PCB portion 300 for forming a via for electrically connecting the foils on conductive layers 1 and 3 together. Similarly, a conductive stake 310 is inserted into through-hole 325 from the bottom side of PCB portion 300 for forming a via for electrically connecting the foils on conductive layers 7 and 9 together. Thus, one through-hole is used to form multiple vias. In this example, the length of conductive stake 305 is less than length 306 and the length of conductive stake 310 is less than length 311. Illustratively there is a space 320 between these conductive stakes. The diameter of conductive stakes 305 and 310 are greater than or equal to diameter 324 (described further below). This ability to form multiple vias from one through-hole is useful in high-density component configurations since different signal paths can now share the same through-hole. It should also be noted that the inventive concept is applicable to a "double-blind-vias." This is shown in FIG. 6. Like numbers indicate similar elements and are not described further. In FIG. 6, conductive stakes 305 and 310 are inserted into holes 345 and 340 of PCB portion 350, respectively. As can be observed from FIG. 6, either of these holes do not completely go through PCB portion 350 and have diameter 324. Upon the insertion of conductive stakes 305 and 310 a "double-blind-via" is formed.

Illustratively, it is assumed that a conductive stake is solid and comprises a phosphor bronze material, the sides of which are gold-over-nickel plated. Such materials are well known. Similarly, a conductive stake can be manufactured using known techniques, e.g., related to connector pins for connectors, etc., and as such will not be described herein.

Figure 7:
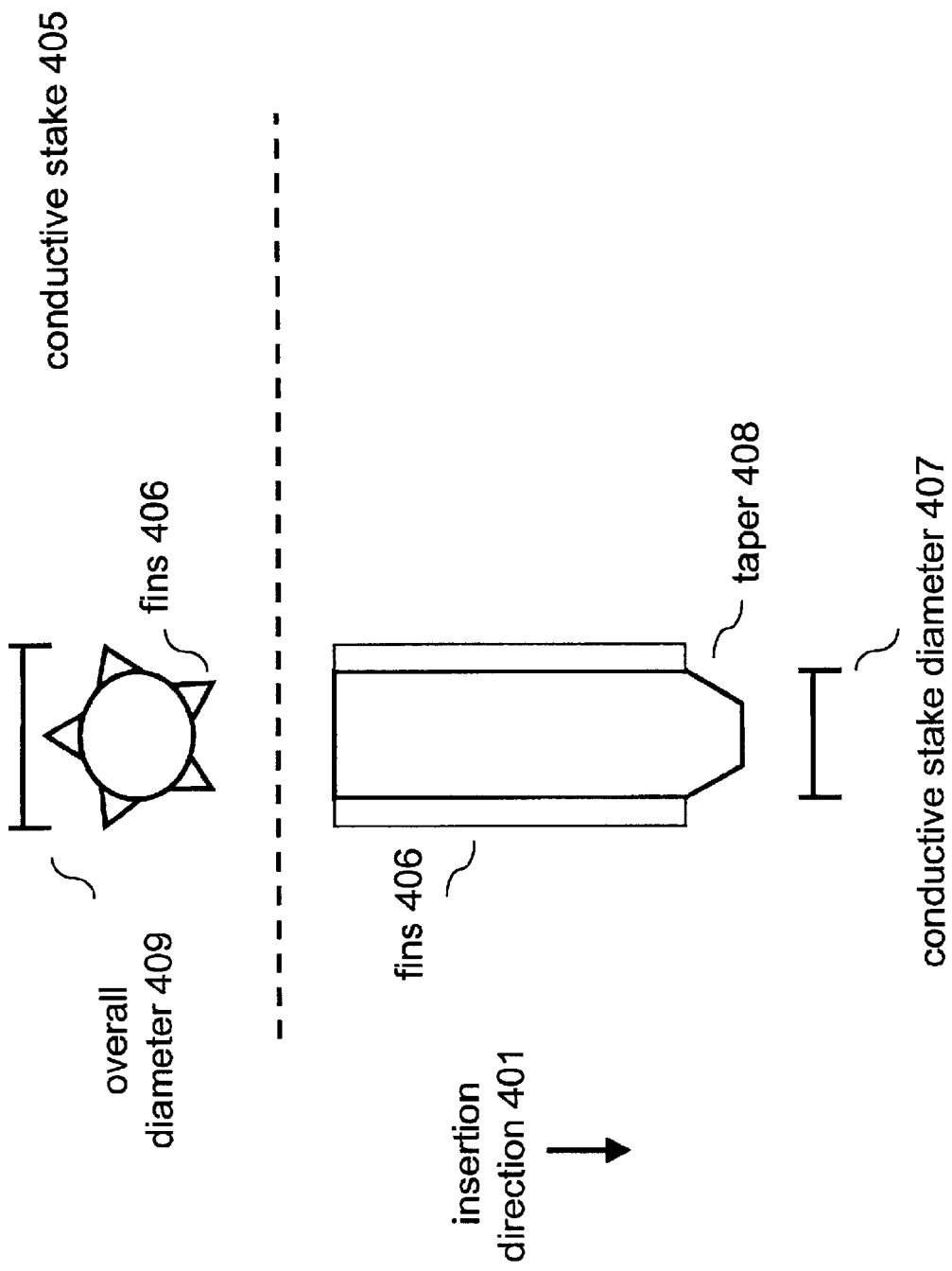
FIG. 7 shows another illustrative embodiment of a conductive stake in accordance with the principles of the invention.

Illustratively, the shape of the conductive stakes illustrated in FIGS. 1 through 6 are cylindrical (as will be described below other shapes are possible, e.g., a polygon, such as a square, or rectangle). With respect to FIGS. 1 through 6, the diameter of the conductive stake should approximate, or be slightly larger than, the diameter of the through-hole (or hole in the case of a blind via or double blind via) to ensure mechanical stability and provide an electrical interconnect. However, other shapes of conductive stakes are possible, such as shown in FIG. 7. The length of a conductive stake is selected as a function of the number of conductive layers that need to be coupled together (thus, length is not specified in FIG. 7). In this example, the length of conductive stake 405 is, approximately, less than or equal to the thickness of the respective PCB (not shown). To simplify insertion into a through-hole, conductive stake 405 is shown as having a certain amount of tapering 408 in the direction of insertion direction 401. Tapering is not required for the inventive concept, as such the amount of tapering is not specified. Conductive stake 405 is illustratively a circle (absent the tapered portion) and has a diameter 407. (Other shapes can be used, e.g., an ellipse.) Conductive stake diameter 407 is less than or equal to the diameter of the through-hole. As can be observed from FIG. 7, fins 406 are attached to conductive stake 405. The purpose of these fins is to cut into the material of the PCB that forms the walls/sides of the through-hole. Thus, providing a mechanical interconnect and, at the conductive layers, cutting into the foil, or copper etching, to provide an electrical interconnect. Illustratively, if the diameter of the through-hole is 12 mils, the conductive stake diameter 407 is approximately 12 mils and each fin extends out 2 mils, such that the overall diameter 409 is approximately 16 mils. (In this example, it should be noted that the fins are not diametrically opposite each other. As such, overall diameter 409 is less than 16 mils.)

Figure 8:
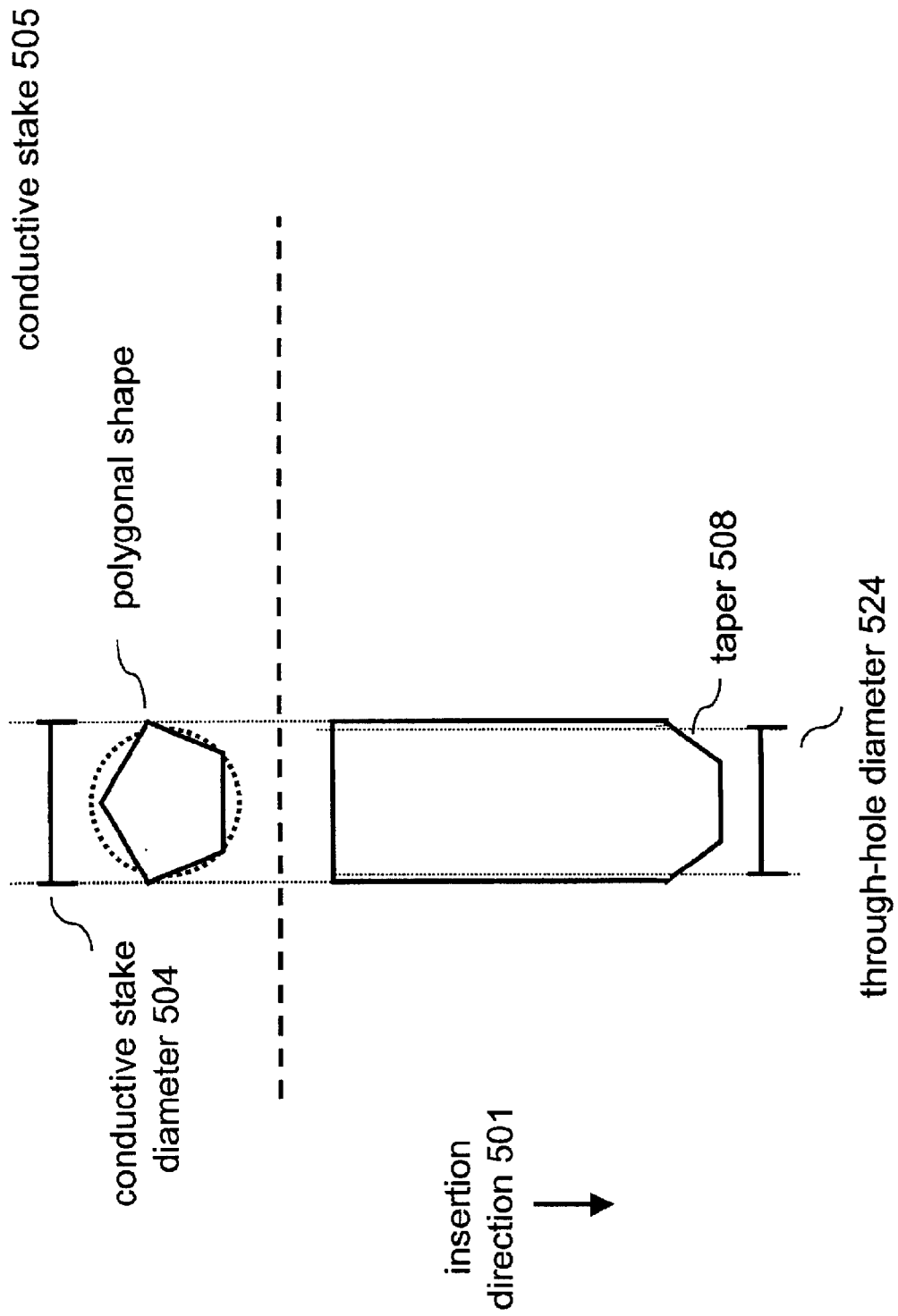
FIG. 8 shows another illustrative embodiment of a conductive stake in accordance with the principles of the invention.

Another illustrative shape for a conductive stake is shown in FIG. 8. As noted above, the length of a conductive stake is selected as a function of the number of conductive layers that need to be coupled together (thus, length is not specified in FIG. 8). In this example, the length of conductive stake 505 is, approximately, less than or equal to the thickness of the respective PCB (not shown). To simplify insertion into a through-hole, conductive stake 505 is shown as having a certain amount of tapering 508 in the direction of insertion direction 501. Tapering is not required for the inventive concept, as such the amount of tapering is not specified.

Conductive stake 505 is illustratively a polygonal shape (absent the tapered portion) and has a diameter 504. In this example, conductive stake 505 is a pentagon (other geometric shapes can be used). Conductive stake diameter 504 is larger than through-hole diameter 524 (the through-hole is not actually shown in FIG. 8). This ensures a tight fit into the through-hole and that there will be a certain amount of "bite" into the material of the PCB from at least a number of the points of conductive stake 505. This "bite" ensures both mechanical stability and, by biting into any foil on a conductive layer, an electrical interconnect. Here, a five-sided polygon was selected for conductive stake 505 so that 5 points are available for making contact with the sides of the through-hole (though not all of the 5 points are required for contact). Illustratively, if the diameter of the through-hole diameter 524 is 12 mils, the conductive stake diameter 504 is 16 mils.

Figure 9:
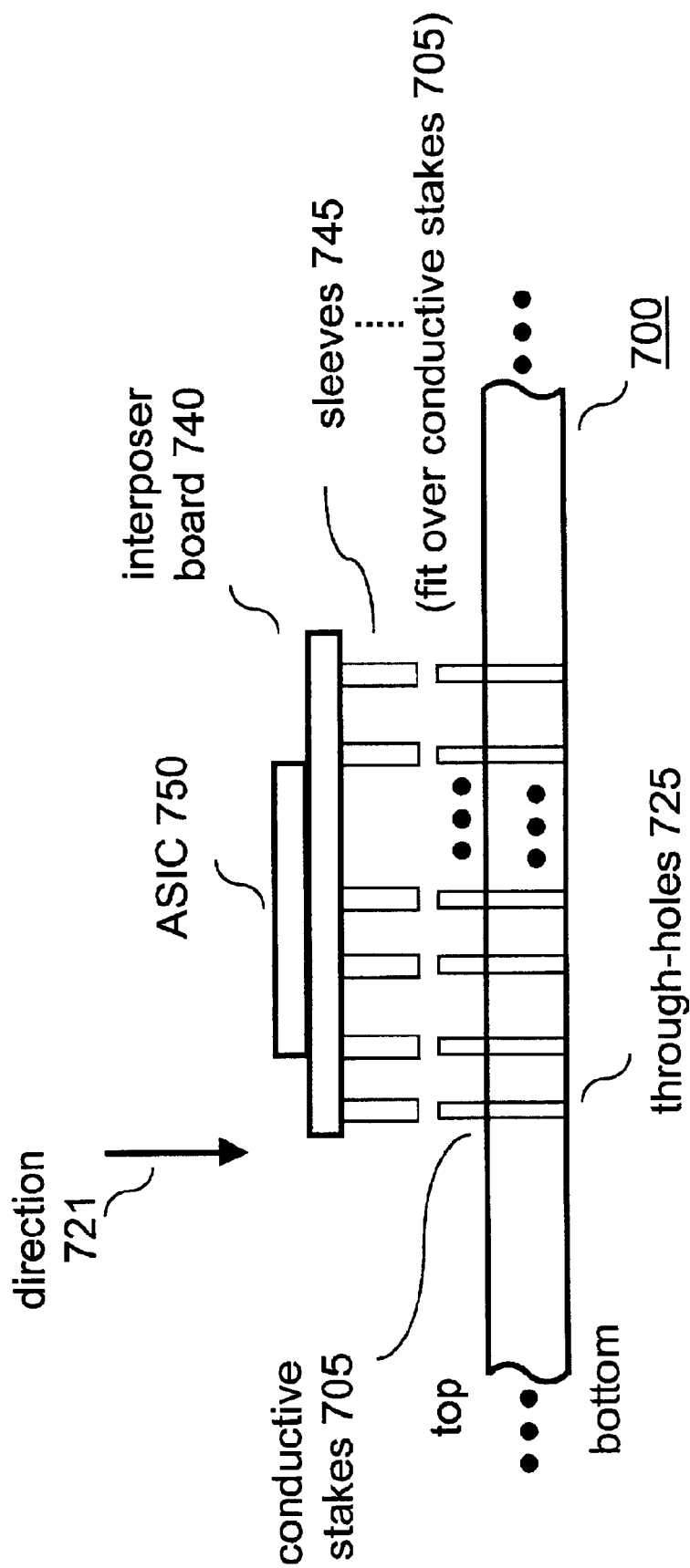
FIG. 9 shows another illustrative use of the inventive concept.

As described above, a conductive stake is inserted into a hole of the PCB and substantially disposed within the PCB such that little, if any portion, of the conductive stake extends beyond a surface of the PCB. However, another illustrative use for a conductive stake is shown in FIG. 9, which illustrates a cross-section of a portion 700 of a PCB. A number of conductive stakes 705 have been placed in through-holes 725. In this 520 example, the conductive stakes 705 extend beyond a surface (e.g., the top) of the PCB. (It should be noted that the conductive stakes could extend out from one or more surfaces (e.g., the top and bottom) of the PCB.) This allows another board, e.g., interposer board 740 to be electrically and mechanically coupled to the PCB. In particular, interposer board 740 comprises a number of conductive sleeves 745, each of which fit over a corresponding conductive stake. Each conductive sleeve has a diameter slightly larger than the diameter of a conductive stake for allowing a press fit (in direction 721) of interposer board 740 to the PCB. In this example, interposer board 745 carries an application-specific-integrated-circuit (ASIC) 750 that is solder mounted to the top of interposer board 740. This type of mounting allows ASIC 750 to be electrically coupled to signal paths (not shown) on the PCB. In the case where the PCB of FIG. 9 is, e.g., a mid-plane, this enables devices, such as represented by ASIC 750, to be directly coupled to the mid-plane.

Figure 10:
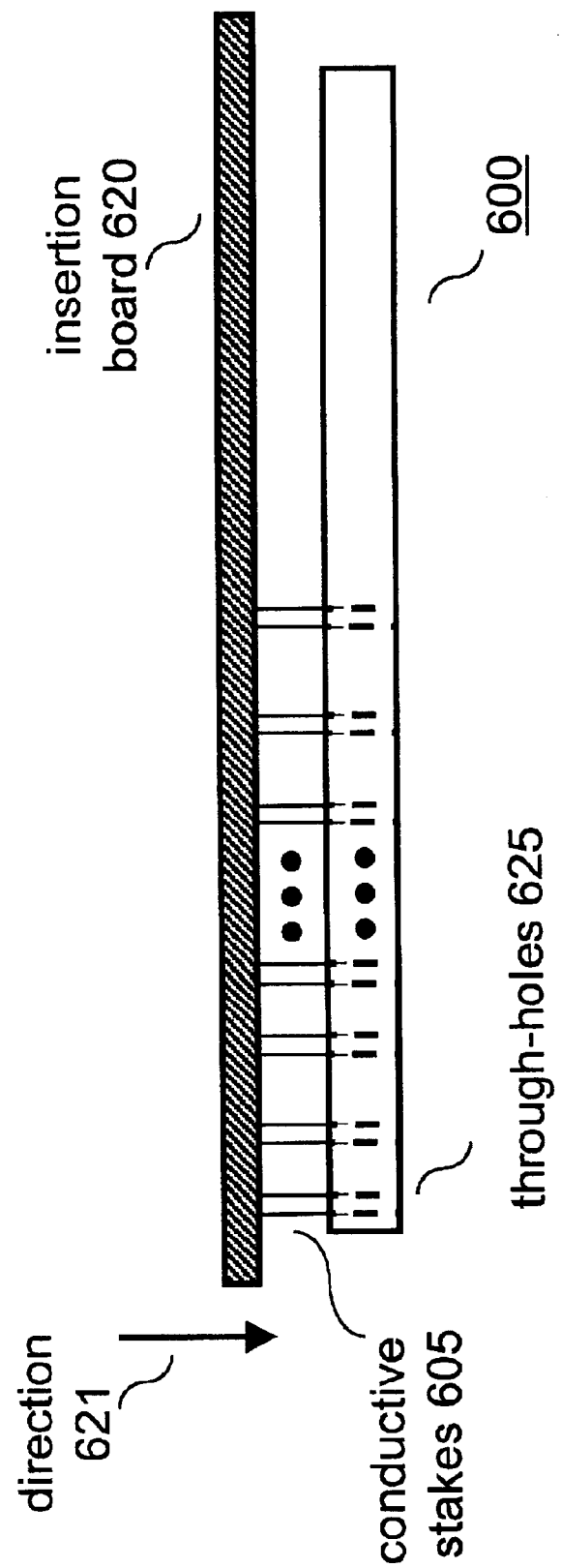
FIG. 10 shows an illustrative method for inserting conductive stakes.

In terms of inserting a conductive stake(s) into a PCB anyone of a number of methods may be used. For example, each one can be done by hand. However, as known in the art a "pin insertion machine" was historically used to insert wire-wrap posts into a board (hence making a wire-wrap board). (In a wire-wrap board, actual wires are wrapped from one wire-wrap post to another wire-wrap post (using a stitching machine) to form the signal paths.) This form of machine can be modified by those skilled in the art to insert conductive stakes into a PCB. Another method is shown in FIG. 10. This method is illustratively performed manually. A number of conductive stakes 605 are initially inserted into corresponding through-holes 625 (the use of tapered conductive stakes would simplify the initial insertion process) of PCB 600. An insertion board 620 (e.g., a piece of metal having suitable dimensions as illustrated in FIG. 10, e.g., similar to PCB 600) is placed over conductive stakes 605 and a force in direction 621 is applied to complete the insertion of the conductive stakes.

As described above, the inventive concept provides an alternative to through-hole-plating such that the amount of real estate taken up by a via is independent of the thickness of a particular PCB. Indeed, the inventive concept allows the diameter of the vias to be kept to a minimum. Thus, the idea allows one to maintain, if not increase, the routing density of signal paths when the thickness of a PCB is increased, compared to that of a plated-through hole approach.

The foregoing merely illustrates the principles of the invention and it will thus be appreciated that those skilled in the art will be able to devise numerous alternative arrangements which, although not explicitly described herein, embody the principles of the invention and are within its spirit and scope. For example, consider the following. Although the inventive concept was described in the context of a particular type of conductive stake, other types of conductive stakes can be used, e.g., hollow ones. Also, although a rigid multi-layer board was illustrated above, the inventive concept is applicable to other types of PCBs, e.g., flexible PCBs. In this case, the conductive stake may have to be mechanically fastened differently than described above, e.g., like a rivet, to ensure mechanical fastening. Similarly, although the inventive concept was described in the context of inserting the conductive stake into the via using a "press fit" for connecting the conductive stake to the conductive layers, other types of connection methods may be used. For example, the conductive stake could initially have a smaller diameter than the through-hole such that, e.g., upon heating, the conductive stake expands to fill the through-hole. In addition, it is not necessary that an entire PCB use the inventive concept. For example, a portion of a PCB, or different portions of a PCB, may use the inventive concept while other portions of the PCB use plated-through holes.

What is claimed is:

1. A multilayer printed circuit board with at least one through hole perpendicular to the plane of the layers of the multiplayer printed circuit board, said multiplayer printed circuit board having at least four trace layers with foil conductors therein and non-conductive materials between each of said four trace layers, said multiplayer printed circuit board having lodged within said through hole two conductive stakes, each of said two conductive stakes having an inner side, the inner side of each stake directed toward a center of said through hole, there being a space within said through hole separating said inner sided of said two stakes, said two conductive stakes providing electrical contact to at least two conductive foils in two of said trace layers separated by a layer of non-conductive material, thus establishing by each said conductive stake an electrical pathway between said foils.

2. The circuit board of claim 1, wherein the conductive stake has a longitudinal polygonal shape such that at least one corner of said polygonal shape when inserted into said through hole extend beyond an internal diameter so as to establish electrical contact with the foils.

3. A multilayer printed circuit board with at least two partial through holes, aligned in a perpendicular axis to the plane of the layers of the multiplayer printed circuit board, said multiplayer printed circuit board having at least four trace layers with foil conductors therein and non-conductive materials between each of said four trace layers, said multilayer printed circuit board having lodged within each said partial through hole a conductive stake, each of said two conductive stakes having an inner side, the inner side of each stake directed toward the partial through hole in which the other conductive stake is lodged, there being at least a portion of a layer of said multilayer circuit board separating said inner sides of said two conductive stakes, said two conductive stakes providing electrical contact to at least two conductive foils in two of said trace layers separated by a layer of non-conductive material, thus establishing by each said conductive stake an electrical pathway between said foils on opposing sides of said multilayer circuit board, separated by said at least a portion of a layer.

4. The circuit board of claim 3 wherein at least one of the conductive stakes has a longitudinal polygonal shape such that at least one corner of said polygonal shape when inserted into said partial through hole extend beyond an internal diameter of said partial through hole so as to establish electrical contact with the foils.

5. A printed circuit board comprising:

at least three layers of material, such that two of the layers of material are electrically conductive and the third layer is an electrical insulator and wherein the insulating layer is disposed between the conductive layers; and at least one conductive stake inserted into a substantially round through hole of a certain diameter established in the printed circuit board for forming a via or electrically connecting foils from the two conductive layers together;

wherein the conductive stake has a filled polygonal shape when viewed in cross-section such that at least one corner of said polygonal shape when inserted into said through hole extend beyond said certain diameter so as to establish contact with the foils for forming the via.

6. The circuit board of claim 5 wherein said polygonal shape is a pentagon.

* * * * *